(12) United States Patent
Ise

(10) Patent No.: US 7,501,190 B2
(45) Date of Patent: Mar. 10, 2009

(54) ORGANIC ELECTROLUMINESCENT DEVICE

(75) Inventor: Toshihiro Ise, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 408 days.

(21) Appl. No.: 11/416,113

(22) Filed: May 3, 2006

(65) Prior Publication Data

US 2006/0263635 A1  Nov. 23, 2006

(30) Foreign Application Priority Data

May 6, 2005 (JP) ............... 2005-135411

(51) Int. Cl.
*H01L 51/54* (2006.01)
*C09K 11/06* (2006.01)

(52) U.S. Cl. ............... 428/690; 428/917; 313/504; 313/506; 257/40; 257/E51.044; 548/103; 546/4; 544/225

(58) Field of Classification Search ............... None
See application file for complete search history.

(56) References Cited

U.S. PATENT DOCUMENTS 6,303,238 B1  10/2001  Thompson et al.

2007/0082284 A1 *  4/2007  Stoessel et al. ............... 430/84

FOREIGN PATENT DOCUMENTS

| WO | WO 00/57676 A1 | 9/2000 |
| WO | WO 2004/108857 A1 * | 12/2004 |
| WO | WO 2005/042550 A1 * | 5/2005 |

* cited by examiner

*Primary Examiner*—Marie R. Yamnitzky
(74) *Attorney, Agent, or Firm*—Sughrue Mion, PLLC

(57) ABSTRACT

An organic electroluminescent device having a pair of electrodes and at least one organic layer interposed between the pair of electrodes, in which the at least one organic layer contains at least one compound represented by formula (I):

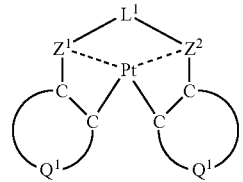

Formula (I)

wherein, $Z^1$ and $Z^2$ each independently represent a nitrogen-containing aromatic six-membered ring coordinated to the platinum through a nitrogen atom; $Q^1$ represents a group of atoms necessary for forming, together with the —C—C—, a nitrogen-containing aromatic five-membered ring; and $L^1$ represents a single bond or a divalent linking group.

11 Claims, No Drawings

ORGANIC ELECTROLUMINESCENT DEVICE

FIELD OF THE INVENTION

The present invention relates to an organic electroluminescent device (hereinafter, referred to also as "organic EL device," "light-emitting device," or "device") capable of emitting light by converting electric energy to light.

BACKGROUND OF THE INVENTION

Energetic studies and developments are being made as to organic electroluminescent devices, because highly luminescent emission is obtained from these devices with low-voltage driving. The organic electroluminescent devices are constituted of an organic layer and a pair of electrodes between which the organic layer is sandwiched. In such devices, electrons injected from the cathode are recombined with holes injected from the anode in the organic layer, to produce excitons, whose energy is utilized to emit light.

Improvement in the efficiency of devices has been recently made by using a phosphorescence-emitting material. Iridium complexes, platinum complexes, and the like are such a phosphorescence-emitting material (see, for example, U.S. Pat. No. 6,303,238 and WO 00/57676). However, devices having both high efficiency and high durability have not been developed. Therefore, there has been a need for development of phosphorescent materials capable of satisfying both.

SUMMARY OF THE INVENTION

The present invention resides in an organic electroluminescent device having a pair of electrodes and at least one organic layer interposed between the pair of electrodes, wherein the at least one organic layer contains at least one compound represented by formula (I):

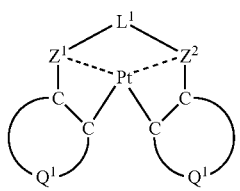

Formula (I)

wherein, $Z^1$ and $Z^2$ each independently represent a nitrogen-containing aromatic six-membered ring coordinated to the platinum through a nitrogen atom; $Q^1$ represents a group of atoms necessary for forming, together with the —C—C—, a nitrogen-containing aromatic five-membered ring; and $L^1$ represents a single bond or a divalent linking group.

Other and further features and advantages of the invention will appear more fully from the following description.

DETAILED DESCRIPTION OF THE INVENTION

According to the present invention, there is provided the following means:

(1) An organic electroluminescent device having a pair of electrodes and at least one organic layer interposed between the pair of electrodes, wherein the at least one organic layer contains at least one compound represented by formula (I):

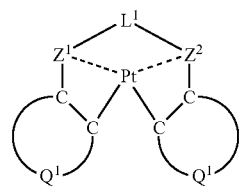

Formula (I)

wherein, $Z^1$ and $Z^2$ each independently represent a nitrogen-containing aromatic six-membered ring coordinated to the platinum through a nitrogen atom; $Q^1$ represents a group of atoms necessary for forming, together with the —C—C—, a nitrogen-containing aromatic five-membered ring; and $L^1$ represents a single bond or a divalent linking group; and (2) The organic electroluminescent device according to the above item (1), wherein the compound represented by formula (I) is a compound represented by formula (II):

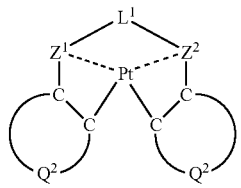

Formula (II)

wherein, $Z^1$, $Z^2$ and $L^1$ have the same meanings as those in formula (I), respectively; and $Q^2$ represents a group of atoms necessary for forming, together with the —C—C—, an imidazole ring or pyrazole ring.

To overcome the above problems in conventional technique, the present inventor found, as a result of making diligent studies, that the above problems can be overcome by an organic EL device containing a complex of a quadridentate ligand having a specific structure in an organic layer.

In the present specification, the substituent group A is defined as follows.

(Substituent Group A)

Examples of the substituent group A include an alkyl group (preferably an alkyl group having 1 to 30 carbon atoms, more preferably 1 to 20 carbon atoms, and most preferably 1 to 10 carbon atoms, e.g., methyl, ethyl, isopropyl, tert-butyl, n-octyl, n-decyl, n-hexadecyl, cyclopropyl, cyclopentyl, cyclohexyl), an alkenyl group (preferably an alkenyl group having 2 to 30 carbon atoms, more preferably 2 to 20 carbon atoms, and most preferably 2 to 10 carbon atoms, e.g., vinyl, allyl, 2-butenyl, 3-pentenyl), an alkynyl group (preferably an alkynyl group having 2 to 30 carbon atoms, more preferably 2 to 20 carbon atoms, and most preferably 2 to 10 carbon atoms, e.g., propargyl, 3-pentynyl), an aryl group (preferably an aryl group having 6 to 30 carbon atoms, more preferably 6 to 20 carbon atoms, and most preferably 6 to 12 carbon atoms, e.g., phenyl, p-methylphenyl, naphthyl, anthranyl), an amino group (preferably an amino group having 0 to 30 carbon atoms, more preferably 0 to 20 carbon atoms, most preferably 0 to 10 carbon atoms, e.g., amino, methylamino, dimethylamino, diethylamino, dibenzylamino, diphenylamino, ditolylamino), an alkoxy group (preferably an alkoxy group having 1 to 30 carbon atoms, more preferably 1 to 20 carbon atoms, most preferably 1 to 10 carbon atoms, e.g., methoxy, ethoxy, butoxy, 2-ethylhexyloxy), an aryloxy group (preferably an aryloxy group having 6 to 30 carbon atoms, more preferably 6 to 20 carbon atoms, most preferably 6 to 12 carbon atoms, e.g., phenyloxy, 1-naphthyloxy, 2-naphthyloxy), a heterocyclicoxy group (preferably a heterocyclicoxy group having 1 to 30 carbon atoms, more preferably 1 to 20 carbon atoms, most preferably 1 to 12 carbon atoms, e.g., pyridyloxy, pyrazyloxy, pyrimidyloxy, quinolyloxy), an acyl group (preferably an acyl group having 1 to 30 carbon atoms, more preferably 1 to 20 carbon atoms, most preferably 1 to 12 carbon atoms, e.g., acetyl, benzoyl, formyl, pivaloyl), an alkoxycarbonyl group (preferably an alkoxycarbonyl group having 2 to 30 carbon atoms, more preferably 2 to 20 carbon atoms, most preferably 2 to 12 carbon atoms, e.g., methoxycarbonyl, ethoxycarbonyl), an aryloxycarbonyl group (preferably an aryloxycarbonyl group having 7 to 30 carbon atoms, more preferably 7 to 20 carbon atoms, most preferably 7 to 12 carbon atoms, e.g., phenyloxycarbonyl), an acyloxy group (preferably an acyloxy group having 2 to 30 carbon atoms, more preferably 2 to 20 carbon atoms, and most preferably 2 to 10 carbon atoms, e.g., acetoxy, benzoyloxy), an acylamino group (preferably an acylamino group having 2 to 30 carbon atoms, more preferably 2 to 20 carbon atoms, and most preferably 2 to 10 carbon atoms, e.g., acetylamino, benzoylamino), an alkoxycarbonylamino group (preferably an alkoxycarbonylamino group having 2 to 30 carbon atoms, more preferably 2 to 20 carbon atoms, and most preferably 2 to 12 carbon atoms, e.g., methoxycarbonylamino), an aryloxycarbonylamino group (preferably an aryloxycarbonylamino group having 7 to 30 carbon atoms, more preferably 7 to 20 carbon atoms, and most preferably 7 to 12 carbon atoms, e.g., phenyloxycarbonylamino), a sulfonylamino group (preferably a sulfonylamino group having 1 to 30 carbon atoms, more preferably 1 to 20 carbon atoms, and most preferably 1 to 12 carbon atoms, e.g., methanesulfonylamino, benzenesulfonylamino), a sulfamoyl group (preferably a sulfamoyl group having 0 to 30 carbon atoms, more preferably 0 to 20 carbon atoms, and most preferably 0 to 12 carbon atoms, e.g., sulfamoyl, methylsulfamoyl, dimethylsulfamoyl, phenylsulfamoyl), a carbamoyl group (preferably a carbamoyl group having 1 to 30 carbon atoms, more preferably 1 to 20 carbon atoms, and most preferably 1 to 12 carbon atoms, e.g., carbamoyl, methylcarbamoyl, diethylcarbamoyl, phenylcarbamoyl), an alkylthio group (preferably an alkylthio group having 1 to 30 carbon atoms, more preferably 1 to 20 carbon atoms, and most preferably 1 to 12 carbon atoms, e.g., methylthio, ethylthio), an arylthio group (preferably an arylthio group having 6 to 30 carbon atoms, more preferably 6 to 20 carbon atoms, and most preferably 6 to 12 carbon atoms, e.g., phenylthio), a heterocyclicthio group (preferably a heterocyclicthio group having 1 to 30 carbon atoms, more preferably 1 to 20 carbon atoms, most preferably 1 to 12 carbon atoms, e.g., pyridylthio, 2-benzimidazolylthio, 2-benzoxazolylthio, 2-benzothiazolylthio), a sulfonyl group (preferably a sulfonyl group having 1 to 30 carbon atoms, more preferably 1 to 20 carbon atoms, and most preferably 1 to 12 carbon atoms, e.g., mesyl, tosyl), a sulfinyl group (preferably a sulfinyl group having 1 to 30 carbon atoms, more preferably 1 to 20 carbon atoms, and most preferably 1 to 12 carbon atoms, e.g., methanesulfinyl, benzenesulfinyl), a ureido group (preferably a ureido group having 1 to 30 carbon atoms, more preferably 1 to 20 carbon atoms, and most preferably 1 to 12 carbon atoms, e.g., ureido, methylureido, phenylureido), a phosphoric acid amido group (preferably a phosphoric acid amido group having 1 to 30 carbon atoms, more preferably 1 to 20 carbon atoms, and most preferably 1 to 12 carbon atoms, e.g., diethylphosphoric acid amido, phenylphosphoric acid amido), a hydroxyl group, a mercapto group, a halogen atom (e.g., fluorine, chlorine, bromine, iodine), a cyano group, a sulfo group, a carboxyl group, a nitro group, a hydroxamic acid group, a sulfino group, a hydrazino group, an imino group, a heterocyclic group (preferably a heterocyclic group having 1 to 30 carbon atoms, and more preferably 1 to 12 carbon atoms; as hetero atoms, e.g., nitrogen, oxygen, sulfur; and specifically, e.g., imidazolyl, pyridyl, quinolyl, furyl, thienyl, piperidyl, morpholino, benzoxazolyl, benzimidazolyl, benzothiazolyl, carbazolyl, azepinyl), a silyl group (preferably a silyl group having 3 to 40 carbon atoms, more preferably 3 to 30 carbon atoms, most preferably 3 to 24 carbon atoms, e.g., trimethylsilyl, triphenylsilyl), and a silyloxy group (preferably a silyloxy group having 3 to 40 carbon atoms, more preferably 3 to 30 carbon atoms, most preferably 3 to 24 carbon atoms, e.g., trimethylsilyloxy, triphenylsilyloxy).

The device of the present invention will be explained in detail.

The device of the present invention has a pair of electrodes and at least one organic layer interposed between the pair of electrodes. The device of the present invention has a pair of electrodes (anode and cathode) on a substrate, and has an organic layer between these two electrodes. From the viewpoint of the nature of the device, it is preferable that at least one of the anode and the cathode is transparent.

The device of the present invention comprises a complex of a quadridentate ligand having a specific structure in the organic layer. While the function of the at least one organic layer is not particularly limited, the organic layer may be, as well as a light-emitting layer, a hole-injecting layer, a hole-transporting layer, an electron-injecting layer, an electron-transporting layer, a hole-blocking layer, an electron-blocking layer, an exciton-blocking layer or a protective layer. Besides the at least one organic layer, a hole-injecting layer, a hole-transporting layer, an electron-injecting layer, an electron-transporting layer, a hole-blocking layer, an electron-blocking layer, an exciton-blocking layer, a protective layer, and the like may be appropriately disposed in the device of the present invention. Also, each of these layers may be provided with other functions.

As an embodiment in which organic layers are laminated in the present invention, it is preferable that the hole-transporting layer, the light-emitting layer and the electron-transporting layer are laminated in this order from the anode side. Further, a charge-blocking layer may be provided between the hole-transporting layer and the light-emitting layer or between the light-emitting layer and the electron-transporting layer. The hole-injecting layer may be provided between the anode and the hole-transporting layer, and the electron-injecting layer may be provided between the cathode and the electron-transporting layer. Each layer may be a secondary layer made of plural layers.

When the organic layer is made of a plurality of layers, the complex defined in the present invention may be incorporated into any layer. Preferably, the complex defined in the present invention is contained in the light-emitting layer. More preferably, it is contained as a light-emitting material in the light-emitting layer. Particularly preferably, it is contained in the light-emitting layer together with at least one host material.

When the complex defined in the present invention is contained as the light-emitting material in the light-emitting layer, the content of the complex is preferably 0.1 mass % or more and 50 mass % or less, more preferably 0.2 mass % or more and 30 mass % or less, still more preferably 0.3 mass % or more and 20 mass % or less, and most preferably 0.5 mass % or more and 15 mass % or less, based on the whole mass of the said layer.

The host material is a compound that serves to inject and carry charges primarily in the light-emitting layer, and does not itself substantially emit light. The term "the host material does not substantially emit light" in this specification means that the amount of light emitted from the compound which does not substantially emit light is preferably 5% or less, more preferably 3% or less, and still more preferably 1% or less, based on the total amount of light emitted from the whole device.

Although no particular limitation is imposed on the concentration of the host material in the light-emitting layer, the host material is preferably a major component in the light-emitting layer (that is, the host material is a component contained in the largest amount). The amount of the host material is preferably 50 mass % or more and 99.9 mass % or less, still more preferably 70 mass % or more and 99.8 mass % or less, particularly preferably 80 mass % or more and 99.7 mass % or less, and most preferably 90 mass % or more and 99.5 mass % or less.

The glass transition point of the host material is preferably 100° C. or more and 500° C. or less, more preferably 110° C. or more and 300° C. or less, and still more preferably 120° C. or more and 250° C. or less.

In the present invention, the fluorescent wavelength of the host material put in a film state and contained in the light-emitting layer is preferably 400 nm or more and 650 nm or less, more preferably 420 nm or more and 600 nm or less, and most preferably 440 nm or more and 550 nm or less.

As the host material that can be used in the present invention, compounds as described in paragraph Nos. [0113] to [0161] of JP-A-2002-100476 ("JP-A" means unexamined published Japanese patent application), and compounds as described in paragraph Nos. [0087] to [0098] of JP-A-2004-214179 may be preferably used. However, the present invention is not limited to these compounds.

The complex represented by formula (I) will be explained.

In formula (I), $Z^1$ and $Z^2$ each represent a nitrogen-containing aromatic six-membered ring coordinated to the platinum through a nitrogen atom, $Q^1$ represents a group of atoms necessary for forming, together with the —C—C—, a nitrogen-containing aromatic five-membered ring, $L^1$ represents a single bond or a divalent linking group, and n is 0 or 1.

$Z^1$ and $Z^2$ described above each represent a nitrogen-containing aromatic six-membered ring coordinated to the platinum through a nitrogen atom. Examples of $Z^1$ and $Z^2$ include pyridine, pyrazine, pyrimidine, pyridazine and triazine. $Z^1$ and $Z^2$ each are preferably pyridine, pyrazine or pyrimidine; more preferably pyridine or pyrazine; and particularly preferably pyridine. $Z^1$ and $Z^2$ may be the same or different from each other. $Z^1$ and $Z^2$ may have a substituent selected from the substituent group A.

The above substituent that $Z^1$ and $Z^2$ may have is preferably an alkyl group, an aryl group, an amino group, an alkoxy group, an aryloxy group, an acyl group, an alkoxycarbonyl group, an alkylthio group, a sulfonyl group, a hydroxy group, a halogen atom, a cyano group, a nitro group, or a heterocyclic group.

$Z^1$ and $Z^2$ may appropriately form a fused ring with other ring. Examples of the ring to be fused include a benzene ring, a pyridine ring, a pyrazine ring, a pyrimidine ring, a pyridazine ring, a thiophene ring, a furan ring, a pyrrole ring, an imidazole ring, a pyrazole ring, a trizaole ring, an oxazole ring, a thiazole ring, an oxadiazole ring, and a thiadiazole ring.

$Z^1$ and $Z^2$ each are preferably a substituted or unsubstituted, pyridine ring, pyrazine ring or pyrimidine ring; more preferably an unsubstituted, pyridine or pyrazine ring; and further preferably an unsubstituted pyridine ring.

$Q^1$ represents a group of atoms necessary for forming, together with the —C—C—, a nitrogen-containing aromatic five-membered ring. Preferably, $Q^1$ represents a group of atoms necessary for forming, together with the two carbon atoms in the —C—C—, a nitrogen-containing aromatic five-membered ring having 1 to 3 nitrogen atoms. Examples of the ring formed by $Q^1$ include a substituted or unsubstituted, pyrrole, pyrazole, imidazole and triazole; preferably includes a substituted or unsubstituted, pyrrole, pyrazole and imidazole; and more preferably includes a substituted or unsubstituted, pyrazole and imidazole.

The ring formed by $Q^1$ may have a substituent, and examples of the substituent include those exemplified as the substituent group A. The substituents on $Q^1$ may bond to each other and the ligand as a whole may form a ring. The substituent on $Q^1$ is preferably an alkyl group, an aryl group, a heterocyclic group, or a cyano group; more preferably an alkyl group or a cyano group; and further preferably a trifluoromethyl group, a tert-butyl group or a cyano group.

The ring formed by $Q^1$ may appropriately form a fused ring with other ring. Examples of the ring to be fused include a benzene ring, a pyridine ring, a pyrazine ring, a pyrimidine ring, a pyridazine ring, a thiophene ring, a furan ring, a pyrrole ring, an imidazole ring, a pyrazole ring, a trizaole ring, an oxazole ring, a thiazole ring, an oxadiazole ring, and a thiadiazole ring.

$L^1$ is a single bond or a divalent linking group. Although not specially limited, the divalent linking group is preferably a linking group containing a carbon atom, a nitrogen atom, an oxygen atom, a sulfur atom or a silicon atom. Specific examples of the divalent linking group are as shown below, but the present invention is not limited thereto.

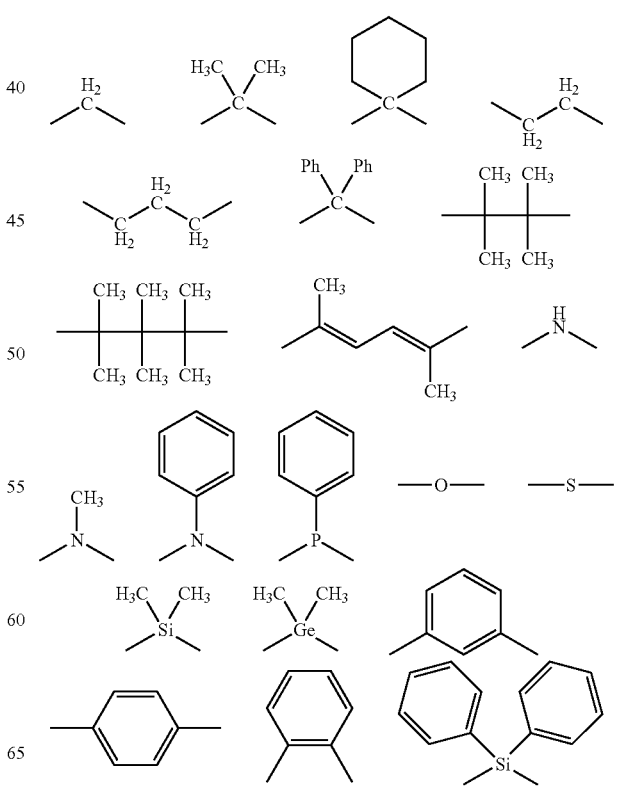

-continued

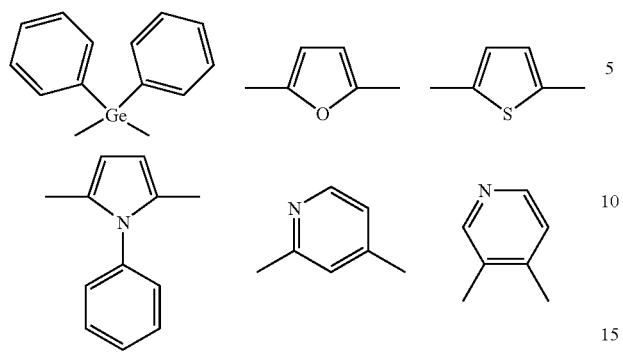

These linking groups may further have a substituent if possible. As the substituent that can be introduced, those exemplified as the substituent group A can be applied.

$L^1$ is preferably a dialkylmethylene group, a diarylmethylene group or a diheteroarylmethylene group; more preferably a dimethylmethylene group or a diphenylmethylene; and further preferably a dimethylmethylene group.

Of the complexes represented by formula (I), a complex represented by formula (II) is more preferred. In formula (II), $Z^1$, $Z^2$ and $L^1$ have the same meanings as those in formula (I), respectively, and preferred scopes thereof are also as described with regard to those in formula (I). $Q^2$ is a group of atoms necessary for forming, together with the —C—C—, an imidazole ring or a pyrazole ring.

Specific examples of the complex represented by formula (I) in the present invention are shown in the followings, but the present invention is not limited thereto. (Hereinafter, Ph represents a phenyl group and $^tBu$ represents a tert-butyl group).

1.
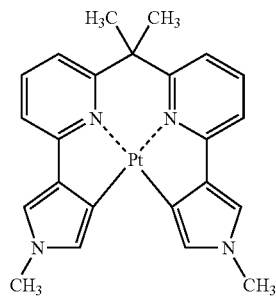

2.
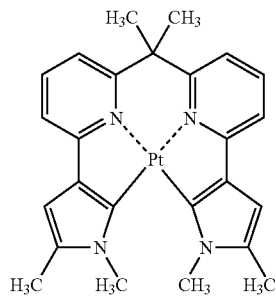

3.
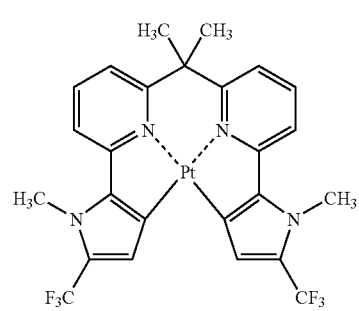

4.

5.
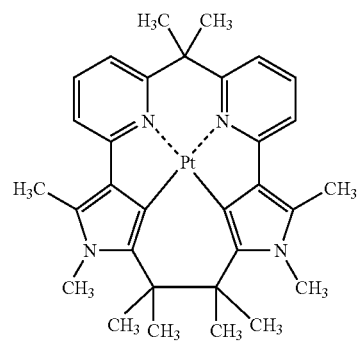

6.

7.
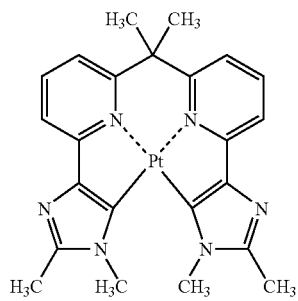

-continued
8.
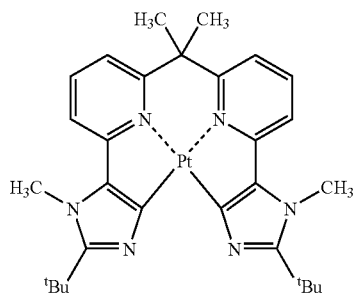
9.
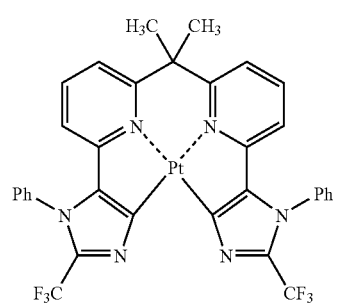
10.
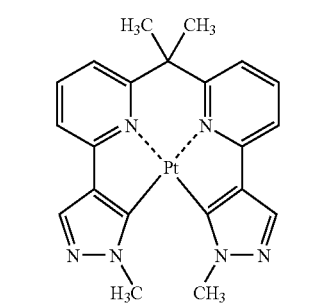
11.
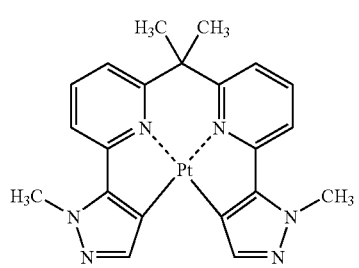
12.
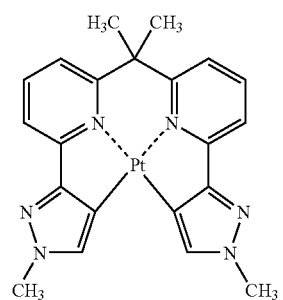
-continued
13.
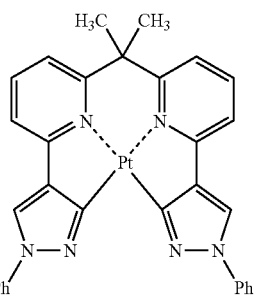
14.
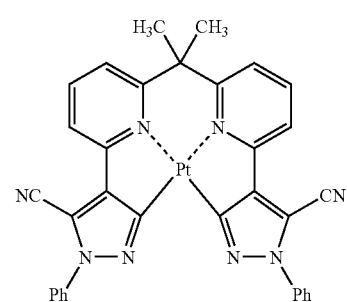
15.
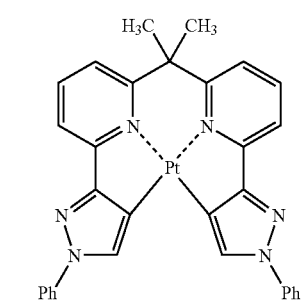
16.
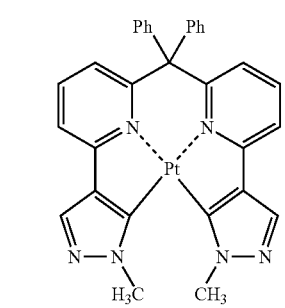
17.
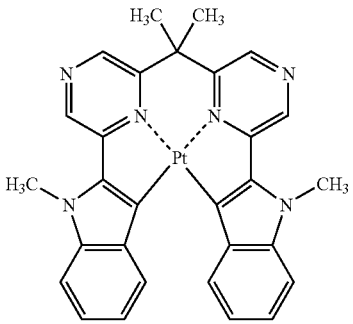

-continued
18. 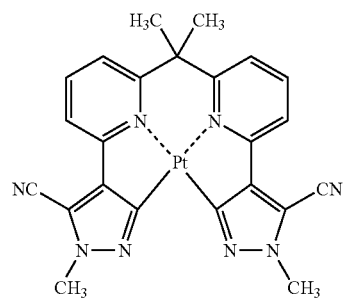
19. 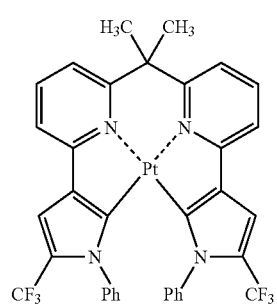
20. 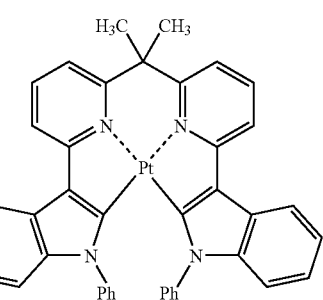
21. 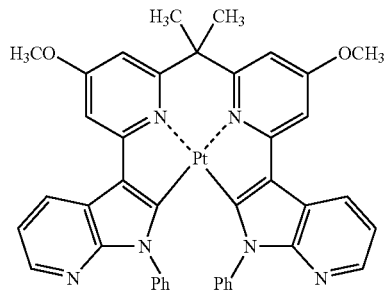
22. 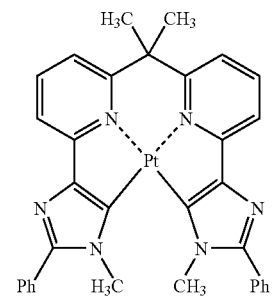
-continued
23. 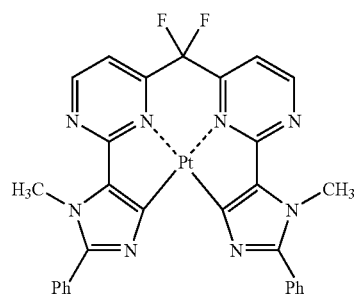
24. 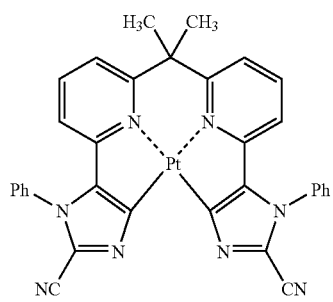
25. 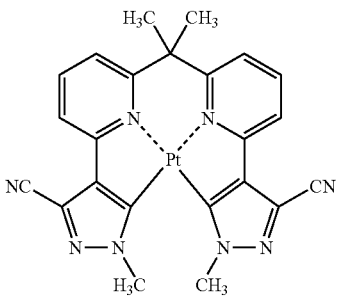
26. 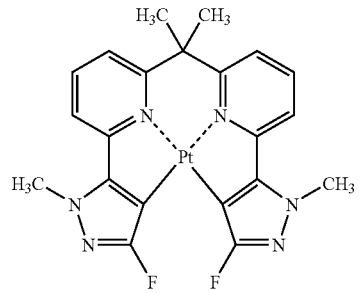
27. 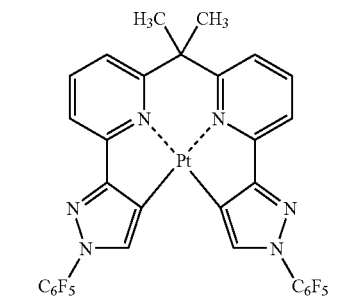

28. 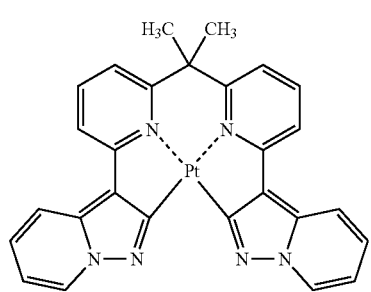
29. 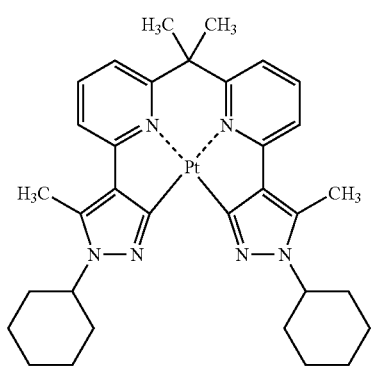
30. 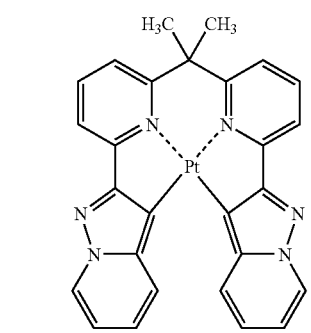
31. 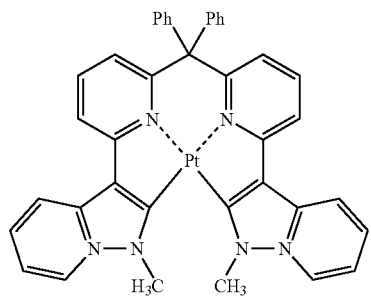
32. 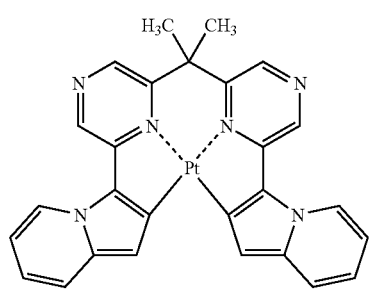
33. 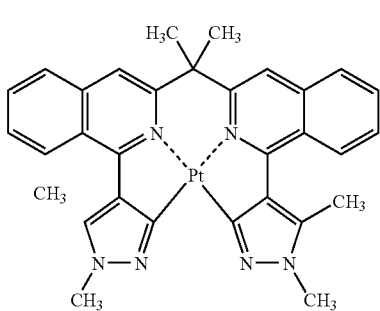
34. 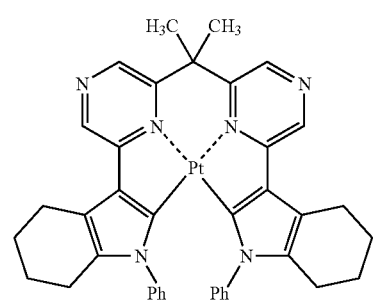
35. 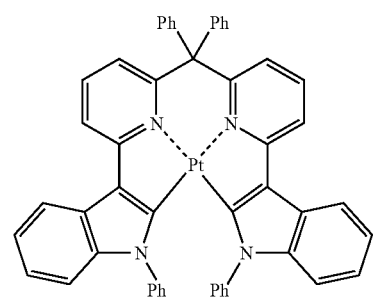
36. 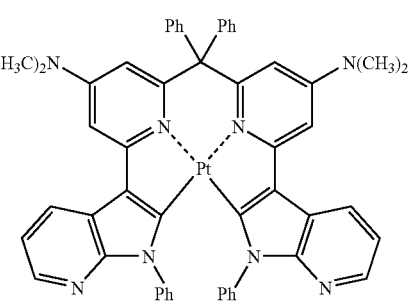
37. 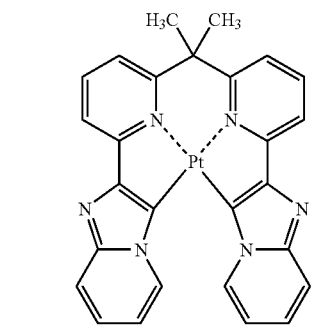

-continued
38.
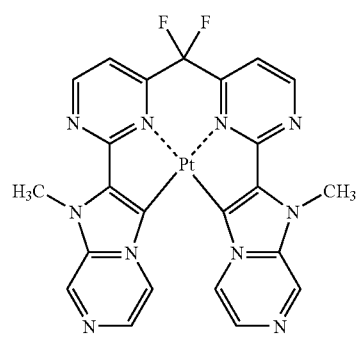
39.
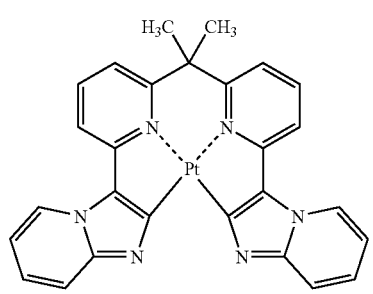
40.
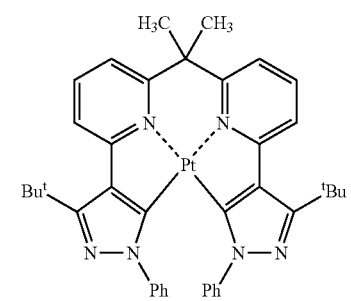
42.
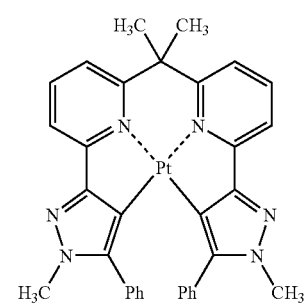
43.
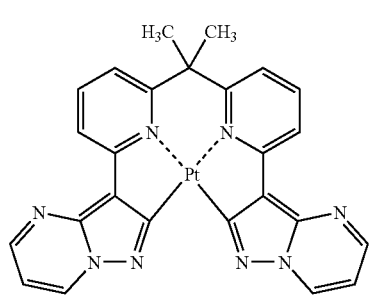
-continued
44.
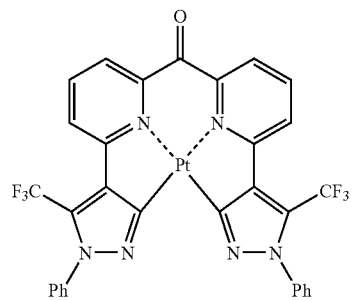
45.
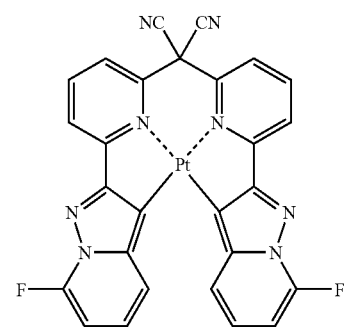
46.
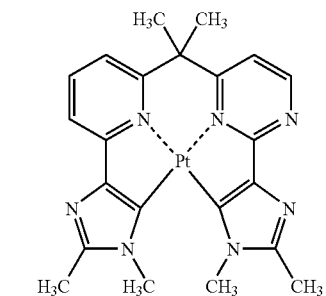
47.
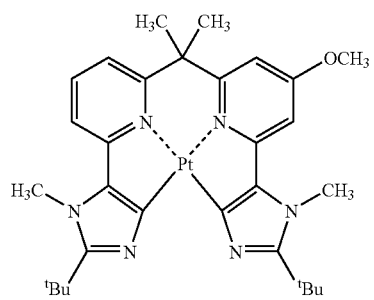
48.
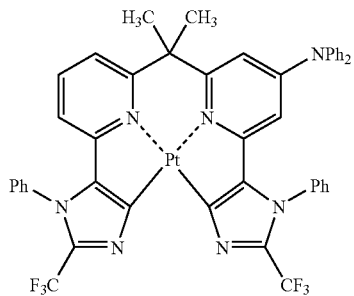

-continued
49.
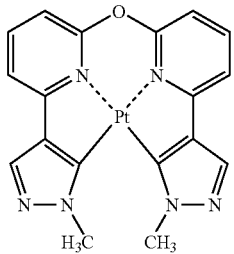
50.
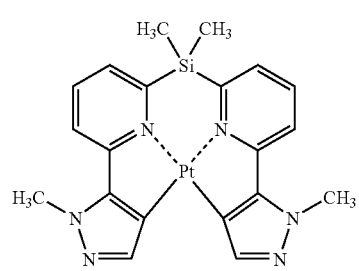
51.
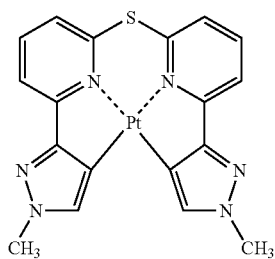
52.
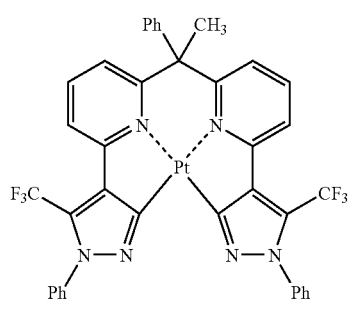
53.
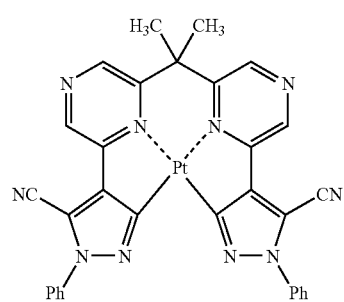
-continued
54.
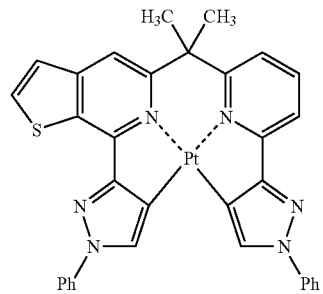
55.
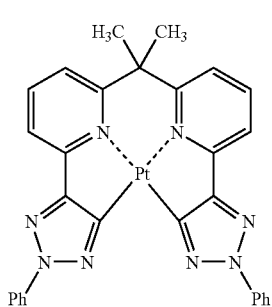
56.
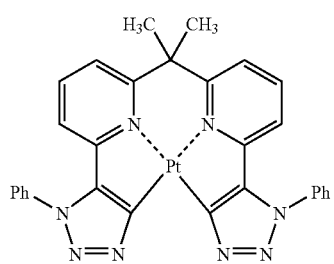
57.
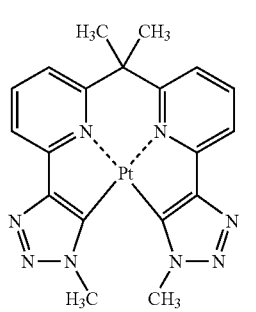
58.
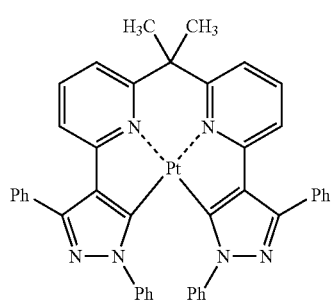

-continued

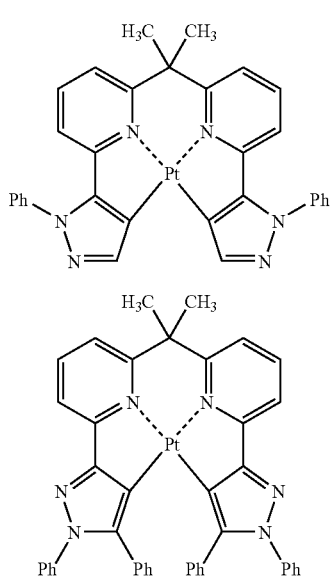

59.

60.

Next, elements constituting the device of the present invention are described in detail.

<Substrate>

The substrate that can be used in the present invention is preferably a substrate that does not scatter or attenuate the light emitted from the organic layer. Examples thereof include inorganic materials such as yttrium stabilized zirconia (YSZ) and glass; and organic materials such as polyesters (for example, polyethylene terephthalate, polybutylene phthalate, and polyethylene naphthalate), polystyrenes, polycarbonates, polyethersulfones, polyarylates, polyimides, polycycloolefins, norbornene resins, and poly(chlorotrifluoroethylene).

For example, when glass is used as the substrate, alkali-free glass may be preferably used in order to lessen amount of ions eluted from glass. When soda lime glass is used as the substrate, it is preferable to use soda lime glass coated with a barrier coat such as silica. When an organic material is used, it is preferable to use an organic material excellent in heat resistance, dimensional stability, solvent resistance, electrical insulating properties, and workability.

Shape, structure, and size of the substrate are not particularly limited, and may be appropriately selected according to uses and purposes of use of the light-emitting device. In general, the substrate is preferably in a plate form. The substrate can be a single-layer structure or a laminated-structure. Further, the substrate can be formed of a single member or a combination of two or more members.

The substrate may be colorless and transparent, or colored and transparent. The substrate is preferably colorless and transparent, since it does not scatter or attenuate the light emitted from the organic light-emitting layer.

A moisture-permeation-preventing layer (gas barrier layer) can be provided on the front surface and back surface of the substrate.

The material of the moisture-permeation-preventing layer (gas barrier layer) is preferably an inorganic substance, such as silicon nitride, silicon oxide, or the like, and the moisture-permeation-preventing layer (gas barrier layer) may be formed by, for example, a high-frequency sputtering method.

Further, when a thermoplastic substrate is used, a hardcoat layer, an undercoat layer, and the like may be provided on the substrate, if necessary.

<Anode>

Usually, the anode generally functions as an electrode to supply holes to the organic layer. As long as the anode has such a function, the shape, structure, and size of the anode are not particularly limited, and may be appropriately selected from those of known electrode materials, according to uses and purposes of use of the light-emitting device. As described above, the anode is generally provided as a transparent anode.

Examples of the material of the anode include simple metals, alloys, metal oxides, electric conductive compounds, and mixtures thereof. Specific examples of the material for the anode include: tin oxides doped with antimony (ATO) or with fluorine (FTO) or the like; conductive metal oxides such as tin oxide, zinc oxide, indium oxide, indium tin oxide (ITO), and indium zinc oxide (IZO); metals such as gold, silver, chromium, and nickel; mixtures or laminates of any of the above-mentioned metals and the conductive metal oxides; inorganic conductive substances such as copper iodide and copper sulfide; organic conductive materials such as polyaniline, polythiophene, and polypyrrole; laminates of any of these materials and ITO; and the like. Among these, conductive metal oxides are preferred, and ITO is particularly preferred from the view point of productivity, high conductivity, transparency, and the like.

The anode can be formed on the above-described substrate by a method which is appropriately selected, taking suitability to the above-described material constituting the anode into consideration, from wet methods such as printing methods and coating methods; physical methods such as vacuum vapor deposition methods, sputtering methods, and ion plating methods; and chemical methods such as chemical vapor deposition (CVD) methods and plasma CVD methods. For example, when ITO is selected as the material of the anode, the anode can be formed by a direct current or high-frequency sputtering method, a vacuum vapor deposition method, an ion plating method, or the like.

In the organic electroluminescent device of the present invention, the position where the anode is formed is not particularly limited, and can be appropriately selected according to the use or purpose of the light-emitting device. Preferably, the anode is formed on the substrate. In this case, the anode may be formed on the whole surface of one side of the substrate, or formed on a part thereof.

At the time of formation of the anode, the anode can be patterned by chemical etching methods such as photolithography, physical etching methods using a laser or the like, vacuum vapor deposition or sputtering methods using a mask, lift-off methods, printing methods and the like.

The thickness of the anode can be selected depending upon a material constituting the anode, and is not specifically limited. It is generally about 10 nm to 50 μm, and preferably 50 nm to 20 μm.

The resistance value of the anode is preferably $10^3$ Ω/□ or less, more preferably $10^2$ Ω/□ or less. When the anode is transparent, the anode may be colorless and transparent, or colored and transparent. In order to take out light from the transparent anode side, the transmittance thereof is preferably set to 60% or more, and more preferably set to 70% or more.

Transparent anodes are described in detail in "Tomei-Doudenmaku no Shintenkai (New Development of Transparent Conductive Films)" (supervised by Yutaka Sawada, and published by CMC, 1999) and the disclosures can be applied to the present invention. In the case of using a plastic substrate having a low heat resistance, it is preferable to form a transparent anode using ITO or IZO and forming into a film at a low temperature of 150° C. or less.

<Cathode>

The cathode generally functions as an electrode to supply electrons to the organic layer. As long as the cathode has such a function, the shape, structure, and size of the cathode are not particularly limited, and may be appropriately selected, according to uses and purposes of use of the light-emitting device, from those of known electrode materials.

As the material constituting the cathode, simple metals, alloys, metal oxides, electric conductive compounds, or mixtures thereof may be used. Specific examples of the material include: alkali metals (such as Li, Na, K, and Cs); alkaline earth metals (such as Mg and Ca); gold, silver, lead, aluminum, a sodium-potassium alloy, a lithium-aluminum alloy, a magnesium-silver alloy, indium, rare earth metals (such as ytterbium), and the like. These materials may be used singly. However, they are preferably used in combination of two or more thereof, in view of obtaining stability and electron-injecting properties compatibly.

Of these materials, alkali metals and alkali earth metals are preferred as the material constituting the cathode, from the standpoint of the electron-injecting properties. From the standpoint of storage stability, a material mainly composed of aluminum is preferred.

Herein, the term "material mainly composed of aluminum" means simple substance of aluminum, alloys comprising aluminum, and alkali metal or alkaline earth metal of 0.01 to 10 mass %, and mixtures thereof (e.g. a lithium-aluminum alloy, a magnesium-aluminum alloy, and the like).

Materials for the cathode are described in JP-A-2-15595 and JP-A-5-121172 in detail, and the materials described in these publications are applicable for the present invention.

A method of forming the cathode is not specifically limited, and the forming of the cathode can be carried out according to a known method. For example, the cathode can be formed by a method selected from wet methods such as printing methods and coating methods; physical methods such as vacuum deposition methods, sputtering methods, and ion plating methods; and chemical methods such as CVD methods, plasma CVD methods, taking suitability to the above-described materials constituting the cathode into consideration. For example, in the case of selecting a metal(s) as the material constituting the cathode, the cathode can be formed by depositing one or two or more kinds of metals simultaneously or sequentially by a sputtering method, or the like.

At the time of formation of the cathode, patterning of the cathode may be conducted by a chemical etching method such as photolithography, a physical etching method using laser or the like, a vacuum vapor deposition method or sputtering method using a mask, a lift-off method, or a printing method.

In the present invention, the position to which the cathode is formed is not specifically limited, but it may be formed on the whole or on a part of the surface of the organic layer.

A dielectric layer made of a fluoride or oxide of an alkali metal or alkali earth metal or some other material may be inserted between the cathode and the organic layer, to have a thickness of 0.1 nm to 5 nm. The dielectric layer may be regarded as a kind of an electron-injecting layer. The dielectric layer can be formed, for example, by a vacuum vapor deposition method, a sputtering method, an ion plating method, or the like.

The thickness of the cathode can be selected depending upon a material constituting the cathode, and is not specifically limited. It is generally about from 10 nm to 5 μm, and preferably from 50 nm to 1 μm.

The cathode may be transparent or opaque. The transparent cathode can be formed by filming the material of the cathode into a thin layer having a thickness of 1 nm to 10 nm, and then laminating a transparent conductive material such as ITO or IZO thereon.

<Organic Layer>

The organic layer in the present invention will be explained.

The device of the present invention comprises at least one organic layer including a light-emitting layer. As organic layers other than the organic light-emitting layer, as described above, the hole-transporting layer, the electron-transporting layer, the hole-blocking layer, the electron-blocking layer, the hole-injecting layer, the electron-injecting layer, and the like can be mentioned.

—Formation of the Organic Layer—

In the organic electroluminescent device of the present invention, each layer for constituting the organic layer can be suitably formed by any one of dry film-forming method such as a vapor deposition method and a sputtering method, a transfer method, a printing method, and the like.

—Light-Emitting Layer—

The light-emitting layer is a layer having a function of emission, upon application of electric field, in which it receives a hole from the anode, the hole-injecting layer, or the hole-transporting layer and it receives an electron from the cathode, the electron-injecting layer, or the electron-transporting layer, and it provides a field where the hole and the electron are re-combined.

The light-emitting layer that can be used in the present invention may be constituted of a light-emitting material alone, or may be constituted of a mixture layer of the host material and the light-emitting material. The light-emitting material may be a fluorescent material or a phosphorescent material. A single dopant may be used or two or more dopants may be used. The host material is preferably a charge-transporting material. The host material may a single material, or a mixture of two or more materials. For example, can be included one constitution of a mixture of an electron-transporting host material with a hole-transporting host material. Further, the light-emitting layer may contain a material that has no electron-transporting capability and does not emit light. The light-emitting layer is preferably a layer containing the complex defined in the present invention as the light-emitting material, and more preferably a layer having a constitution composed of at least one of the host material and the complex defined in the present invention.

Further, the light-emitting layer may be a single layer, or may be composed of two or more layers that emit light in different colors.

Examples of a fluorescent material that can be used in the present invention, other than the above-described materials, include benzoxazole and derivatives thereof, benzimidazole and derivatives thereof, benzothiazole and derivatives thereof, styrylbenzene and derivatives thereof, polyphenyl and derivatives thereof, diphenylbutadiene and derivatives thereof, tetraphenylbutadiene and derivatives thereof, naphthalimide and derivatives thereof, coumarin and derivatives thereof, condensed aromatic compounds, perynone and derivatives thereof, oxadiazole and derivatives thereof, oxazine and derivatives thereof, aldazine and derivatives thereof, pyralidine and derivatives thereof, cyclopentadiene and derivatives thereof, bisstyrylanthracene and derivatives thereof, quinacridone and derivatives thereof, pyrrolopyridine and derivatives thereof, thiadiazolopyridine and derivatives thereof, cyclopentadiene and derivatives thereof, styrylamine and derivatives thereof, diketopyrrolopyrrole and derivatives thereof, aromatic dimethylidyne compounds; various complexes, typical examples of which include complexes of 8-quinolinol and derivatives thereof, and complexes of pyrromethene and derivatives thereof, polymer compounds such as polythiophene, polyphenylene, and polyphenylenevinylene; and organosilane compounds and derivatives thereof.

Examples of the phosphorescent material that can be used in the present invention include a complex containing a transition metal atom or a lanthanoid atom, besides the complex defined in the present invention.

Although not specially limited, examples of the transition metal atom include ruthenium, rhodium, palladium, tungsten, rhenium, osmium, iridium and platinum. The transition metal atom is preferably rhenium, iridium or platinum.

Examples of the lanthanoid atom include lanthanum, cerium, praseodymium, neodymium, samarium, europium, gadolinium, terbium, dysprosium, holmium, erbium, thulium, ytterbium and lutetium. Of these lanthanoid atoms, neodymium, europium and gadolinium are preferred.

Examples of the ligand of the complex include ligands described in G. Wilkinson et al., Comprehensive Coordination Chemistry, Pergamon Press (1987); H. Yersin, Photochemistry and Photophysics of Coordination Compounds, Springer-Verlag (1987); and Akio Yamamoto, Organometallic Chemistry—Principles and Applications—, Shokabo Publishing Co. Ltd. (1982).

Preferred specific examples of the ligand include a halogen ligand (preferably a chlorine ligand), a nitrogen-containing heterocyclic ligand (e.g., phenylpyridine, benzoquinone, quinolinol, bipyridyl, or phenanthroline), a diketone ligand (e.g., acetylacetone), a carboxylic acid ligand (e.g., acetic acid ligand), a carbon monoxide ligand, an isonitrile ligand, and a cyano ligand. More preferred is a nitrogen-containing heterocyclic ligand. The above-described complex may have one transition metal atom in the compound, or may be a so-called polynuclear complex containing two or more transition metal atoms. The complex may contain different metal atoms at the same time.

The content of the phosphorescent material in the light-emitting layer is preferably 0.1 to 40 mass %, and more preferably 0.5 to 20 mass %.

Examples of the host material contained in the light-emitting layer in the present invention includes ones having a carbazole skeleton, a diarylamine skeleton, a pyridine skeleton, a pyrazine skeleton, a triazine skeleton or an arylsilane skeleton; and the materials that are described with regard to the hole-injecting layer, the hole-transporting layer, the electron-injecting layer and the electron-transporting layer to be described later.

The thickness of the light-emitting layer is not particularly restricted, but it is generally preferably from 1 nm to 500 nm, more preferably from 5 nm to 200 nm, and still more preferably from 10 nm to 100 nm.

—Hole-Injecting Layer and Hole-Transporting Layer—

The hole-injecting layer and the hole-transporting layer are layers each having a function of receiving a hole from the anode or a layer at the anode side, to transport it to a layer at the cathode side. Specifically, the hole-injecting layer and the hole-transporting layer each are preferably a layer containing carbazole derivatives, triazole derivatives, oxazole derivatives, oxadiazole derivatives, imidazole derivatives, polyaryalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne-series compounds, porphyrin-series compounds, organosilane derivatives, carbon, or the like.

The thickness of each of the hole-injecting layer and the hole-transporting layer is preferably 500 nm or less, from the viewpoint that the driving voltage is decreased.

The thickness of the hole-transporting layer is preferably from 1 nm to 500 nm, more preferably from 5 nm to 200 nm, and further preferably from 10 nm to 100 nm. The thickness of the hole-injecting layer is preferably from 0.1 nm to 200 nm, more preferably from 0.5 nm to 100 nm, and further preferably from 1 nm to 100 nm.

The hole-injecting layer or hole-transporting layer may have a single-layer structure of one kind or two or more kinds of the above materials, or alternatively, a multilayer structure comprising plural layers having the same composition or different compositions.

—Electron-Injecting Layer and Electron-Transporting Layer—

The electron-injecting layer and the electron-transporting layer are layers each having a function of receiving an electron from the cathode or a layer at the cathode side, to transport it to a layer at the anode side. Specifically, the electron-injecting layer and the electron-transporting layer each are preferably a layer containing triazole derivatives, oxazole derivatives, oxadiazole derivatives, imidazole derivatives, fluorenone derivatives, anthraquinodimethane derivatives, anthrone derivatives, diphenylquinone derivatives, thiopyrandioxide derivatives, carbodiimide derivatives, fluorenylidenemethane derivatives, distyrylpyrazine derivatives, tetracarboxylic acid anhydrides of aromatic rings such as naphthalene and perylene, phthalocyanine derivatives, various complexes represented by complexes of 8-quinolinol derivatives, metallophthalocyanines, and complexes having benzoxazole or benzothiazole ligands; and organosilane compounds.

The thickness of each of the electron-injecting layer and the electron-transporting layer is preferably 500 nm or less from the viewpoint that the driving voltage is decreased.

The thickness of the electron-transporting layer is preferably from 1 nm to 500 nm, more preferably from 5 nm to 200 nm, and further preferably from 10 nm to 100 nm. The thickness of the electron-injecting layer is preferably from 0.1 nm to 200 nm, more preferably from 0.2 nm to 100 nm, and further preferably from 0.5 nm to 50 nm.

The electron-injecting layer and the electron-transporting layer may have a single-layer structure comprising one or two or more of the above materials, or may have a multilayer structure comprising a plurality of layers of the same composition or different compositions.

—Hole-Blocking Layer—

The hole-blocking layer has a function that prevents holes transported from the anode to the light-emitting layer from passing through the cathode side. In the present invention, the hole-blocking layer may be provided as an organic layer that is adjacent to the cathode-side of the light-emitting layer.

Examples of an organic compound that forms the hole-blocking layer include an aluminum complex such as BAlq; a triazole derivative, and a phenanthroline derivative such as BCP.

The thickness of the hole-blocking layer is preferably 1 nm to 500 nm, more preferably 5 nm to 200 nm, and further preferably, 10 nm to 100 nm.

The hole-blocking layer may have a single-layer structure of one kind or two or more kinds of the above-mentioned materials, or alternatively, a multilayer structure comprising plural layers having the same composition or different compositions.

<Protective Layer>

In the present invention, the whole organic EL device may be protected by a protective layer.

Materials contained in the protective layer may be any material as long as they have a function of preventing substances which accelerate deterioration of the device, such as water or oxygen, from entering the device.

Specific examples of the materials include metals such as In, Sn, Pb, Au, Cu, Ag, Al, Ti, and Ni; metal oxides such as MgO, SiO, $SiO_2$, $Al_2O_3$, GeO, NiO, CaO, BaO, $Fe_2O_3$, $Y_2O_3$, and $TiO_2$; metal nitrides such as $SiN_x$ and $SiN_xO_y$; metal fluorides such as $MgF_2$, LiF, $AlF_3$, and $CaF_2$; polyethylene, polypropylene, polymethyl methacrylate, polyimide, polyurea, polytetrafluoroethylene, polychlorotrifluoroethylene, polydichlorodifluoroethylene, copolymers of chlorotrifluoroethylene and dichlorodifluoroethylene, copolymers prepared by copolymerizing a monomer mixture of tetrafluoroethylene and at least one comonomer; fluorine-containing copolymers having cyclic structures on the main chain, water-absorbing substances having a water absorption rate of at least 1%, and moisture-proof substances having a water absorption rate of at most 0.1%.

The forming process of the protective layer is also not particularly restricted, and, for example, a vacuum deposition process, a sputtering process, a reactive sputtering process, an MBE (molecular beam epitaxy) process, a cluster ion beam process, an ion-plating process, a plasma polymerization process (a high frequency exciting ion-plating process), a plasma CVD process, a laser CVD process, a heat CVD process, a gas source CVD process, a coating process, a printing process, and a transfer process can be applied.

<Sealing>

The entire device of the present invention may be sealed by a sealing container. It is allowable to fill the space between the sealing container and the device with a moisture absorbent or an inert liquid. The kind of the moisture absorbent is not particularly limited. Examples thereof include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, molecular sieves, zeolite, and magnesium oxide. The kind of the inert liquid is not limited. Examples thereof include paraffins, liquid paraffins, fluorine-series solvents (such as perfluoroalkanes, perfluoroamines, and perfluoroethers), chlorine-series solvents, and silicone oils.

The device of the present invention can have a constitution similar to those of known devices except for the above-described points.

The device of the present invention can be caused to emit light by applying a direct-current (which may include alternating-current component, if necessary) voltage (usually from 2 to 15V), or a direct current between the anode and the cathode.

For the driving of the device of the present invention, methods described in the following can be utilized: JP-A-2-148687, JP-A-6-301355, JP-A-5-29080, JP-A-7-134558, JP-A-8-234685 and JP-A-8-241047; Japanese Patent No. 2784615; U.S. Pat. Nos. 5,828,429, and 6,023,308, and the like.

The device of the present invention can be preferably used in such fields as display devices, displays, backlights, electrophotography, illumination light sources, recording light sources, exposure light sources, reading light sources, signs, signboards, interiors, and optical communications.

According to the present invention, it is possible to provide a device having high luminance efficiency and high durability. Further, according to the present invention, it is possible to provide a complex compound preferable to provide the device.

By incorporating the complex represented by formula (I) or (II) in the present invention into the organic layer, there can be provided an organic electroluminescent device having high luminance efficiency (e.g. external quantum efficiency) and excellent durability. Further, by employing the complex defined in the present invention that has a certain specific structure, there can be provided a device that emits light with high external quantum efficiency in a blue light region, and that has excellent durability.

The present invention will be described in more detail based on the following examples, but the invention is not intended to be limited thereto.

EXAMPLES

The compound represented by formula (I) or (II) in the present invention can be synthesized according to a known synthesis method using, as a starting material, the compound (A) that can be synthesized, for example, by methods described in Journal of Organic Chemistry 53, 786, (1988), G. R. Newkome et al., on page 789, left column, line 53 to right column, line 7, page 790, left column, lines 18 to 38, and page 790, right column, lines 19 to 30, or a combination of these methods.

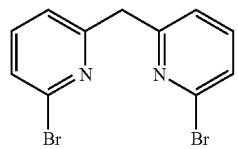

Compound (A)

<Organic Electroluminescent Device>

1. Making of the Organic Electroluminescent Devices (1) Making of the Organic Electroluminescent Device of the Present Invention A glass substrate, having an ITO film of thickness 0.5 mm and a square size of 2.5 cm on each side (surface resistance 10Ω/□, manufactured by GEOMATEC CO., LTD.), was placed in a cleaning vessel and ultrasonically cleaned in a solution of 2-propanol, followed by UV-ozone treatment for 30 minutes. On this transparent anode (ITO film), the following organic compound layers were consecutively vapor-deposited, by a vacuum vapor deposition method.

The vapor deposition rate in the example of the present invention was 0.2 nm/second, unless otherwise specified. The vapor deposition rate was measured by means of a quartz oscillator. The film thicknesses described below were also measured by means of a quartz oscillator.

| | |
|---|---|
| (First hole-transporting layer) | Copper phthalocyanine CuPC: Film thickness 10 nm |
| (Second hole-transporting layer) | NPD: Film thickness 40 nm |
| (Light-emitting layer) | Layer formed of the mixture of 92 mass % of MCP with 8 mass % of the exemplified compound 15: Film thickness 30 nm |
| (First electron-transporting layer) | 1,3,5-TTB: Film thickness 10 nm |
| (Second electron-transporting layer) | 1,3,5-TPB: Film thickness 10 nm |
| (Third electron-transporting layer) | Alq: Film thickness 10 nm |

Compounds used in this example were as follows.

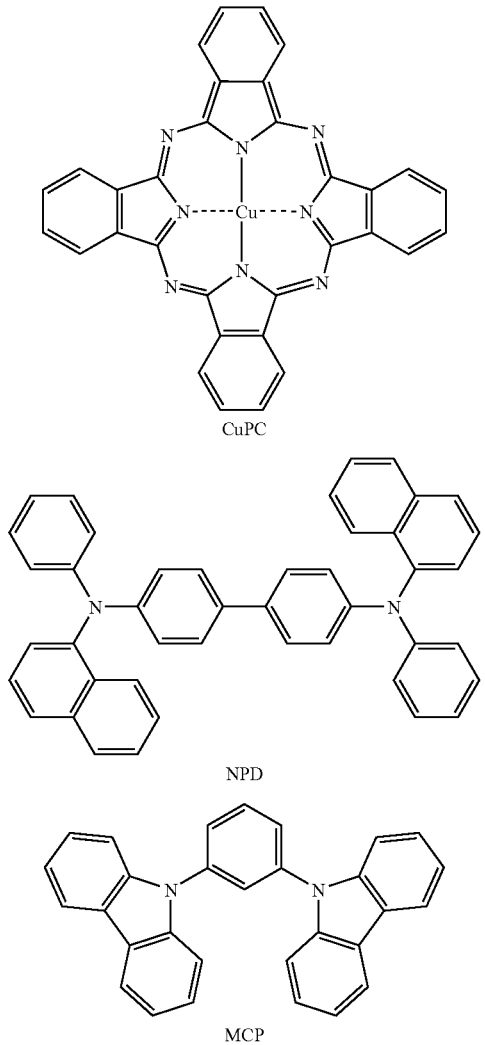

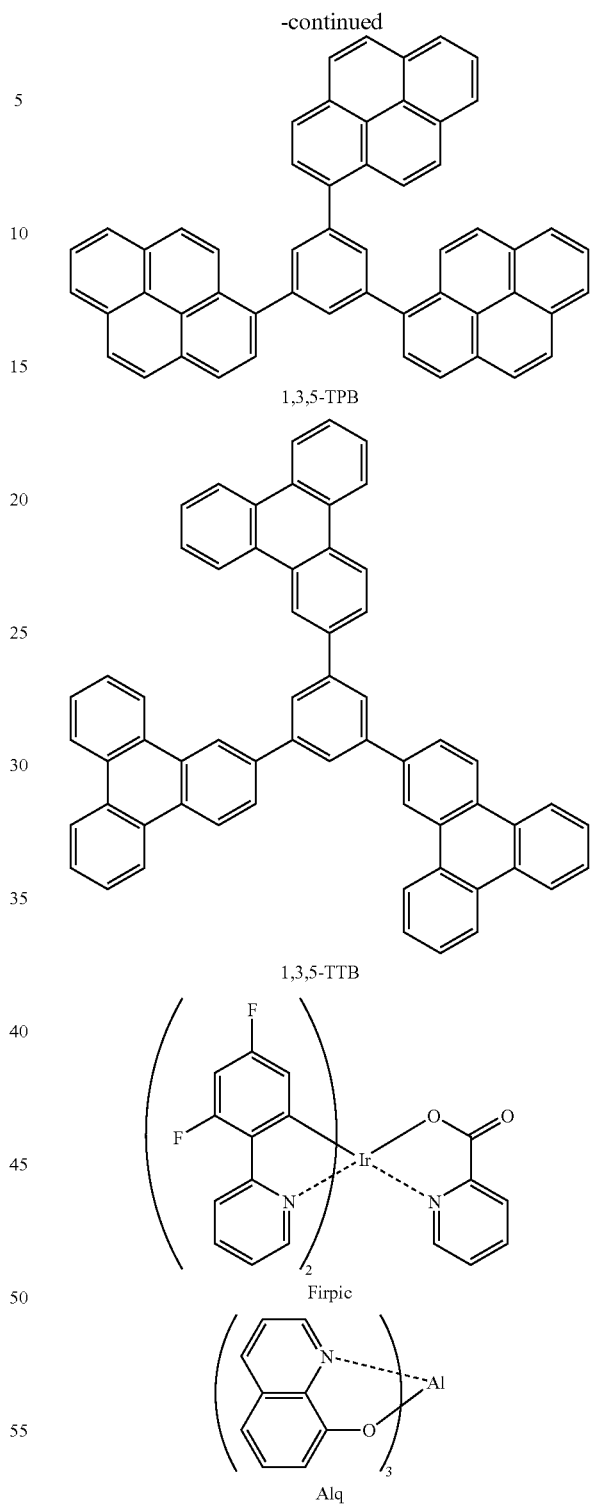

Finally, a 0.1 nm-thick lithium fluoride layer and a 100 nm metal aluminum layer were formed, in this order, by vapor deposition, to form a cathode.

The thus-obtained product was placed in a glove box whose atmosphere was replaced with argon, without exposing it to atmosphere, and it was sealed in a sealing can of stainless steel with an ultraviolet-curable adhesive (XNR5516HV (trade name), manufactured by Nagase-CIBA Ltd.), to give an organic electroluminescent device of the present invention.

(2) Making of the Organic Electroluminescent Device of the Comparative Example

An organic electroluminescent device of the comparative example was made in the same manner as in the making of the organic electroluminescent device of the present invention, except that the light-emitting material was changed from the pyrazole-series compound defined in the present invention to Firpic as shown above.

2. Evaluation of the Organic Electroluminescent Devices

The above-obtained organic electroluminescent devices were evaluated by the following methods.

(1) Measurement of Emission Spectrum

When voltage of 10 V was applied to the organic electroluminescent devices of the present invention and the comparative example, light emission derived from the light-emitting materials was observed in both of the devices.

(2) Evaluation of Driving Durability

Each of the above-obtained organic electroluminescent devices was independently set in an OLED test system ST-D model (trade name), manufactured by Tokyo System Kaihatsu CO., and driven in a constant current mode at a normal direction constant current of 0.4 mA, to determine the luminance half time $t_{0.5}$ (time for decreasing of the luminance to 50% of the initial luminance). The results are shown in Table 1.

TABLE 1

| Device | $t_{0.5}$ |
|---|---|
| Device of the present invention | 33 hours |
| Device of the comparative example | 15 hours |

As is shown from the above results, it was possible to obtain an organic electroluminescent device having high efficiency and high durability by using the compound defined in the present invention.

Having described my invention as related to the present embodiments, it is my intention that the invention not be limited by any of the details of the description, unless otherwise specified, but rather be construed broadly within its spirit and scope as set out in the accompanying claims.

What is claim is:

1. An organic electroluminescent device having a pair of electrodes and at least one organic layer interposed between the pair of electrodes, wherein the at least one organic layer contains at least one compound represented by formula (I):

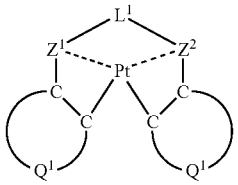

Formula (I)

wherein, $Z^1$ and $Z^2$ each independently represent a nitrogen-containing aromatic six-membered ring coordinated to the platinum through a nitrogen atom; $Q^1$ represents a group of atoms necessary for forming, together with the —C—C—, a substituted or unsubstituted, pyrazole, imidazole or triazole ring; and $L^1$ represents a single bond or a divalent linking group.

2. The organic electroluminescent device according to claim 1, wherein the compound represented by formula (I) is a compound represented by formula (II):

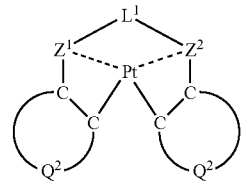

Formula (II)

wherein, $Z^1$, $Z^2$ and $L^1$ have the same meanings as those in formula (I), respectively; and $Q^2$ represents a group of atoms necessary for forming, together with the —C—C—, a substituted or unsubstituted, imidazole or pyrazole ring.

3. The organic electroluminescent device according to claim 1, wherein $Z^1$ and $Z^2$ each are a substituted or unsubstituted, pyridine ring, pyrazine ring or pyrimidine ring.

4. The organic electroluminescent device according to claim 1, wherein $Z^1$ and $Z^2$ each are an unsubstituted pyridine ring.

5. The organic electroluminescent device according to claim 1, wherein $L^1$ contains at least one atom selected from the group consisting of a carbon atom, a nitrogen atom, an oxygen atom, a sulfur atom and a silicon atom.

6. The organic electroluminescent device according to claim 1, wherein the compound represented by formula (I) and at least one host material are contained in a light-emitting layer of the device.

7. The organic electroluminescent device according to claim 6, wherein the content of the compound represented by formula (I) is 0.1 mass % or more and 50 mass % or less, based on the whole mass of the light-emitting layer.

8. The organic electroluminescent device according to claim 6, wherein the thickness of the light-emitting layer is 1 nm to 500 nm.

9. The organic electroluminescent device according to claim 1, wherein $L^1$ is a dialkylmethylene group, a diarylmethylene group or a diheteroarylmethylene group.

10. The organic electroluminescent device according to claim 1, wherein $L^1$ is a dimethylmethylene group or a diphenylmethylene group.

11. The organic electroluminescent device according to claim 1, wherein $L^1$ is a dimethylmethylene group.

* * * * *